United States Patent
Aritome (10) Patent No.: US 9,269,441 B2
(45) Date of Patent: Feb. 23, 2016

(54) METHOD FOR OPERATING NON-VOLATILE MEMORY DEVICE

(75) Inventor: Seiichi Aritome, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 677 days.

(21) Appl. No.: 13/353,429

(22) Filed: Jan. 19, 2012

(65) Prior Publication Data

US 2012/0307565 A1  Dec. 6, 2012

(30) Foreign Application Priority Data

May 31, 2011  (KR) .......................... 10-2011-0052321

(51) Int. Cl.

| G11C 16/06 | (2006.01) |
|---|---|
| G11C 16/04 | (2006.01) |
| G11C 16/10 | (2006.01) |
| G11C 16/34 | (2006.01) |

(52) U.S. Cl.
CPC ............ *G11C 16/0483* (2013.01); *G11C 16/10* (2013.01); *G11C 16/3409* (2013.01)

(58) Field of Classification Search
CPC .... G11C 16/0483; G11C 16/26; G11C 16/10; G11C 11/5642; G11C 16/107; G11C 16/3427; G11C 16/16; G11C 11/5628; G11C 13/004; G11C 13/0069; G11C 16/34; G11C 11/1673; G11C 16/3422; G11C 16/3431
USPC ............. 365/185.29, 185.03, 185.22, 185.24, 365/185.28, 185.3
See application file for complete search history.

(56) References Cited

U.S. PATENT DOCUMENTS

| 6,134,140 | A  | * | 10/2000 | Tanaka et al. ............. | 365/185.03 |
|---|---|---|---|---|---|
| 6,442,074 | B1 | * | 8/2002 | Hamilton et al. ......... | 365/185.29 |
| 6,515,910 | B1 | * | 2/2003 | Lee .................... | G11C 16/3404 365/185.09 |
| 7,499,338 | B2 | * | 3/2009 | Ito ...................... | G11C 16/3468 365/185.17 |
| 7,724,576 | B2 | * | 5/2010 | Noh ................... | G11C 16/3404 365/185.17 |
| 2008/0089132 | A1 | * | 4/2008 | Ito ............................ | 365/185.22 |
| 2008/0175069 | A1 | * | 7/2008 | Wang et al. .............. | 365/185.29 |

FOREIGN PATENT DOCUMENTS

| KR | 1020080069498 | 7/2008 |
|---|---|---|
| KR | 1020080088188 | 10/2008 |

OTHER PUBLICATIONS

Office Action issued by the Korean Intellectual Property Office on Aug. 3, 2012.

* cited by examiner

*Primary Examiner* — Tuan T Nguyen
*Assistant Examiner* — Uyen B Tran
(74) *Attorney, Agent, or Firm* — IP & T Group LLP (57) ABSTRACT

A method for operating a non-volatile memory device includes performing an erase operation onto a memory block including a plurality of memory cells, and performing a first soft program operation onto all the memory cells of a string, after the erase operation, grouping word lines of the string into a plurality of word line groups, and performing a second soft program operation onto memory cells coupled with the word lines of each word line group.

9 Claims, 8 Drawing Sheets

METHOD FOR OPERATING NON-VOLATILE MEMORY DEVICE

CROSS-REFERENCE TO RELATED APPLICATIONS

The present application claims priority of Korean Patent Application No. 10-2011-0052321, filed on May 31, 2011, which is incorporated herein by reference in its entirety.

BACKGROUND

1. Field

Exemplary embodiments of the present invention relate to a method for operating a non-volatile memory device, and more particularly, to a method for operating a non-volatile memory device including an erase operation and a Soft program-On-Chip (SOC) operation.

2. Description of the Related Art

A non-volatile memory device is a memory device capable of retaining stored data although power is turned off.

A non-volatile memory device may perform a program operation, an erase operation, and a read operation. In particular, a NAND-type non-volatile memory device performs a program operation and an erase operation by injecting or discharging charges to or from a floating gate electrode through Fowler-Nordheim (F-N) tunneling. In a NAND-type non-volatile memory device, programmed memory cells have a positive (+) threshold voltage, and erased memory cells have a negative (−) threshold voltage. As the range of threshold voltage distribution is narrower, the operation characteristics of a memory device are improved.

Hereafter, a conventional non-volatile memory device and an operation method thereof are described with reference to the accompanying figures.

Figure 1:
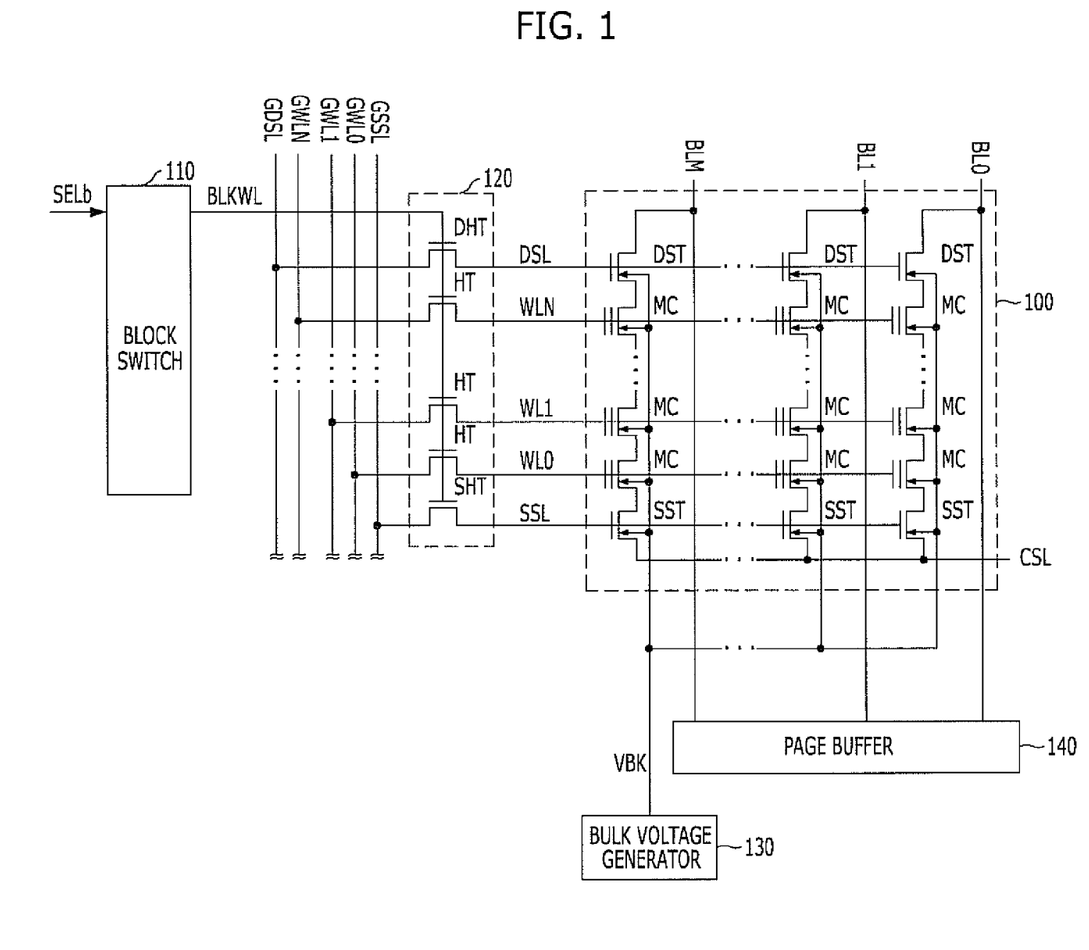
FIG. 1 illustrates a structure of a conventional non-volatile memory device.

FIG. 1 illustrates a structure of a conventional non-volatile memory device.

Referring to FIG. 1, the non-volatile memory device includes a memory block 100, a block switch 110, a high-voltage switch 120, a bulk voltage generator 130, and a page buffer 140.

The memory block 100 includes a plurality of memory cells MC for storing data, a plurality of word lines WL0 to WLN that select and enable a memory cell MC, and a plurality of bit lines BL0 to BLM that output the data of the memory cells MC. The word lines WL0 to WLN are in parallel to each other, and the bit lines BL0 to BLM are in parallel to each other as well. The bit lines BL0 to BLM may cross the word lines WL0 to WLN. In the memory block 100, the memory cells MC are serially coupled between a source selection transistor SST and a drain selection transistor DST to form a string structure. One end of each string is coupled with a corresponding bit line BL0 to BLM, while the other end of the string is coupled with a common source line CSL in parallel. The gates of a plurality of drain selection transistors DST are coupled with a drain selection line DSL, and the gates of a plurality of source selection transistors SST are coupled with a source selection line SSL. Also, the gates of the memory cells MC are coupled with the word lines WL0 to WLN, and a set of memory cells coupled with the same word line is called a page.

The block switch 110 is selected by a selection signal SELb, and the block switch 110 may enable the high-voltage switch 120 by driving a node BLKWL into a high level based on the selection signal SELb.

The high-voltage switch 120 includes a plurality of high-voltage transistors SHT, HT and DHT, and the high-voltage switch 120 controls the connection between global word lines GWL0 to GWLN and local word lines WL0 to WLN according to the level of the node BLKWL. In particular, during an erase operation, the high-voltage switch 120 couples the global word lines GWL0 to GWLN that are coupled with a ground voltage with the local word lines WL0 to WLN to apply the ground voltage to the local word lines WL0 to WLN.

The bulk voltage generator 130 generates a bulk voltage VBK according to a program/erase/read operation and applies the generated bulk voltage VBK to a bulk of the memory block 100, for example, a P-well. In particular, during an erase operation, the bulk voltage generator 130 generates a high voltage and applies the generated high voltage to the bulk of the memory block 100. The high voltage applied to the bulk during an erase operation is referred to as an erase voltage.

The page buffer 140 includes a plurality of page buffer circuits (not shown). The page buffer 140 performs a program operation or a read operation by being coupled with a bit line BL. Further description of the structure and operation of the page buffer is omitted.

Figure 2:
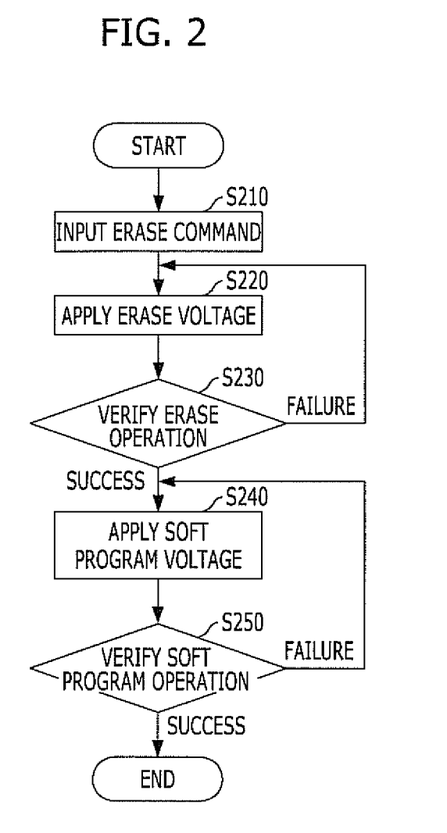
FIG. 2 is a flowchart describing a method for operating a conventional non-volatile memory device.

FIG. 2 is a flowchart describing a method for operating a conventional non-volatile memory device. Specifically, the figure describes an erase operation and a Soft program-On-Chip (SOC) operation.

First, when an erase command and an address that designates a target memory block 100 to be erased are inputted to a decoder in step S210, a corresponding block switch 110 is selected, and the high-voltage switch 120 is enabled to apply a ground voltage to all the word lines WL0 to WLN of the memory block 100 based on the output of the block switch 110.

Subsequently in step S220, an erase voltage is generated by the bulk voltage generator 130 and applied to the bulk of the memory block 100, and accordingly, the data stored in the memory cells MC of the corresponding memory block 100 are erased.

In step S230, the page buffer 140 performs a read operation and verifies whether the data of all the memory cells MC of the corresponding memory block 100 are erased.

If any of the data of the memory cells MC is not erased, the verification step determines that the erase operation was to be a failure, and the process of the step S220 is repeated.

Otherwise, when the data of all the memory cells MC are erased, more specifically, when the erase operation is decided to be a success, the erase operation ends and the method moves to step 240 to perform a Soft program-On-Chip (SOC) operation.

More specifically, when the erase operation ends, the SOC operation is performed in step S240 by applying a soft program voltage to the word lines WL0 to WLN while applying a ground voltage to the bulk of the memory block 100.

Subsequently in step S250, the SOC operation is verified based on an SOC verification voltage. More specifically, the SOC verification voltage is a negative voltage ranging from approximately −1V to approximately −2V. The SOC operation verification step determines whether there is a memory cell MC whose threshold voltage is equal to or exceeds the SOC verification voltage.

The SOC operation verification is performed for each string. If there is a memory cell whose threshold voltage is increased to the SOC verification voltage among the memory cells MC of a particular string, the string is decided to have succeeded in the SOC operation, and the string is referred to as a 'pass string.' Conversely, if there is no memory cell whose threshold voltage is equal to or exceeds the SOC verification voltage among the memory cells MC of a particular string, the string is decided to have failed in the SOC operation, and the string is referred to as a 'non-pass string.'

When the number of pass strings reaches a predetermined number X after performing the SOC operation verification onto all strings, the SOC operation is decided to be successful and the SOC operation is ended.

Conversely, when the number of pass strings does not reach a predetermined number X, the SOC operation is decided to have failed and the operation of the step S240 is repeated by increasing the SOC operation voltage. While performing the operation of the step S240 again, the threshold voltage of the memory cells of pass strings is prevented from being varied while the SOC operation voltage is applied by applying a bit line program prevention voltage, e.g., a power source voltage Vcc, to the bit lines coupled to the pass strings. On the other hand, the threshold voltage of the memory cells of the non-pass strings is increased while the SOC operation voltage is applied by applying a bit line program voltage, e.g., 0V, to the bit lines coupled to the non-pass strings.

Figure 3:
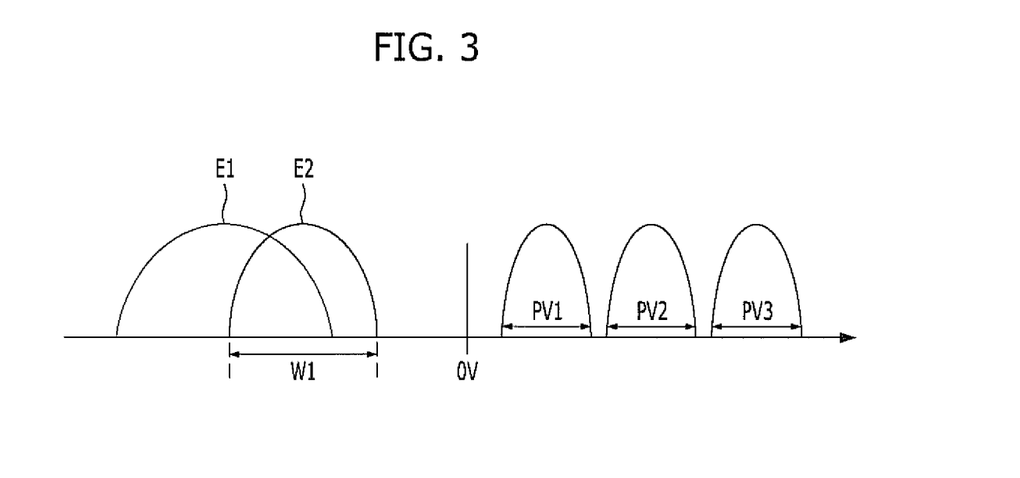
FIG. 3 illustrates effects of the method for operating the conventional non-volatile memory device.

FIG. 3 illustrates the effects of the method for operating the conventional non-volatile memory device.

Referring to FIG. 3, a curve E2 indicates the threshold voltage distribution of memory cells MC whose SOC operation ends and a curve E1 indicates the threshold voltage distribution of memory cells MC whose erase operation ends. The curve E2 is shifted to the right when compared with the curve E1. The shifting of curve E2 to the right signifies that the threshold voltage of the memory cells is raised through the SOC operation.

Other than increasing in the threshold voltage, the SOC operation decreases the range W1 of the threshold voltage distribution of memory cells, but only to a limited extent. The threshold voltage distribution after an SOC operation decreases only a limited amount because each of the memory cells has diverse characteristics, such as having different threshold voltage according to the position. Also, when the threshold voltage of any one cell among the memory cells MC reaches the verification voltage, the SOC operation ends.

As described above, when the range W1 of the threshold voltage distribution of the memory cells MC is wide, the range PV1, PV2 and PV3 of the threshold voltage distribution of the memory cells MC in the program state becomes wide as well. Accordingly, the margin between the levels is decreased in multi-level cells.

SUMMARY

An embodiment of the present invention is directed to a method for operating a non-volatile memory device that performs an erase operation and a Soft program-On-Chip (SOC) operation that may decrease the range of the threshold voltage distribution of memory cells in an erase state.

In accordance with an embodiment of the present invention, a method for operating a non-volatile memory device includes: performing an erase operation onto a memory block including a plurality of memory cells; and performing a first soft program operation onto all the memory cells of a string, after the erase operation; grouping word lines of the string into a plurality of word line groups, and performing a second soft program operation onto memory cells coupled with the word lines of each word line group.

DETAILED DESCRIPTION

Exemplary embodiments of the present invention will be described below in more detail with reference to the accompanying figures. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A method for operating a non-volatile memory device in accordance with the embodiments of the present invention performs a Soft program-On-Chip (SOC) operation for each word line group. Since a memory cell has different characteristics according to its position, and more specifically, according to the word line the memory cell is coupled with, the width of threshold voltage distribution of memory cells in an erase state may be narrowed by performing an SOC operation for each word line group. The method of grouping word lines and the method of performing the SOC operation for each word line group may be modified. These methods are described in detail in the following embodiments.

Figure 4:
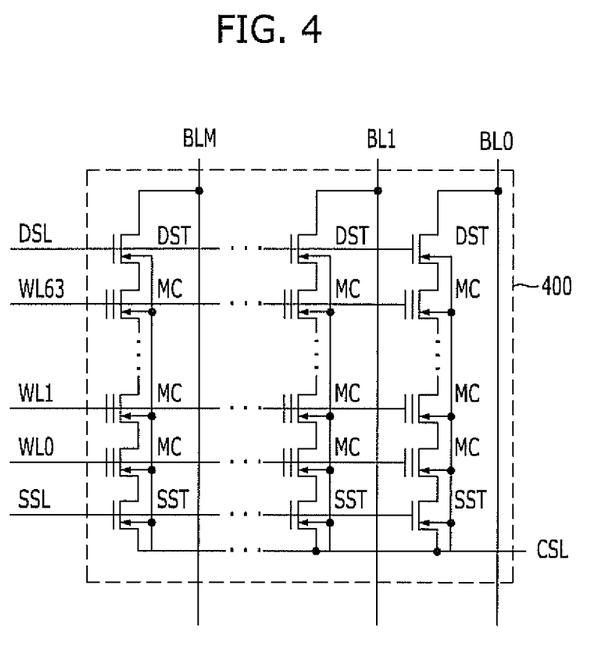
FIG. 4 illustrates a structure of a non-volatile memory device in accordance with an embodiment of the present invention.

FIG. 4 illustrates a structure of a non-volatile memory device in accordance with an embodiment of the present invention. The figure illustrates the structure of a memory block. The constituent elements required by the memory block, such as a page buffer, may be provided, but are not shown for illustration purposes. Also, although one memory block is shown in the figure, the non-volatile memory device may include a plurality of memory blocks.

Referring to FIG. 4, the non-volatile memory device in accordance with the embodiment of the present invention includes at least one memory block 400. The memory block 400 includes a plurality of memory cells MC for storing data, a plurality of word lines WL0 to WL63 for selecting and enabling a memory cell MC, and a plurality of bit lines BL0 to BLM for inputting/outputting the data of the memory cell MC. In the non-volatile memory device, the memory cells MC are serially coupled between a source selection transistor SST and a drain selection transistor DST to form a string structure. One end of each string is coupled with a corresponding bit line BL0 to BLM, while the other end of the string is coupled with a common source line CSL in parallel. The gates of a plurality of drain selection transistors DST are coupled with a drain selection line DSL, and the gates of a plurality of source selection transistors SST are coupled with a source selection line SSL. Also, the gates of the memory cells MC are coupled with the word lines WL0 to WL63, and a set of memory cells coupled with the same word line is called a page.

This embodiment of the present invention presents a non-volatile memory device where the number of the word lines WL0 to WL63 included in the memory block 400 is 64, more specifically, that the number of memory cells MC included in each string is 64. However, the present invention is not limited to 64 word lines, and the number of the word lines may be modified, for example, a non-volatile memory device with 16 word lines or 32 word lines.

Hereafter, an erase operation and an SOC operation of the non-volatile memory device are described with reference to FIG. 4 and FIGS. 5 to 9.

Figure 5:
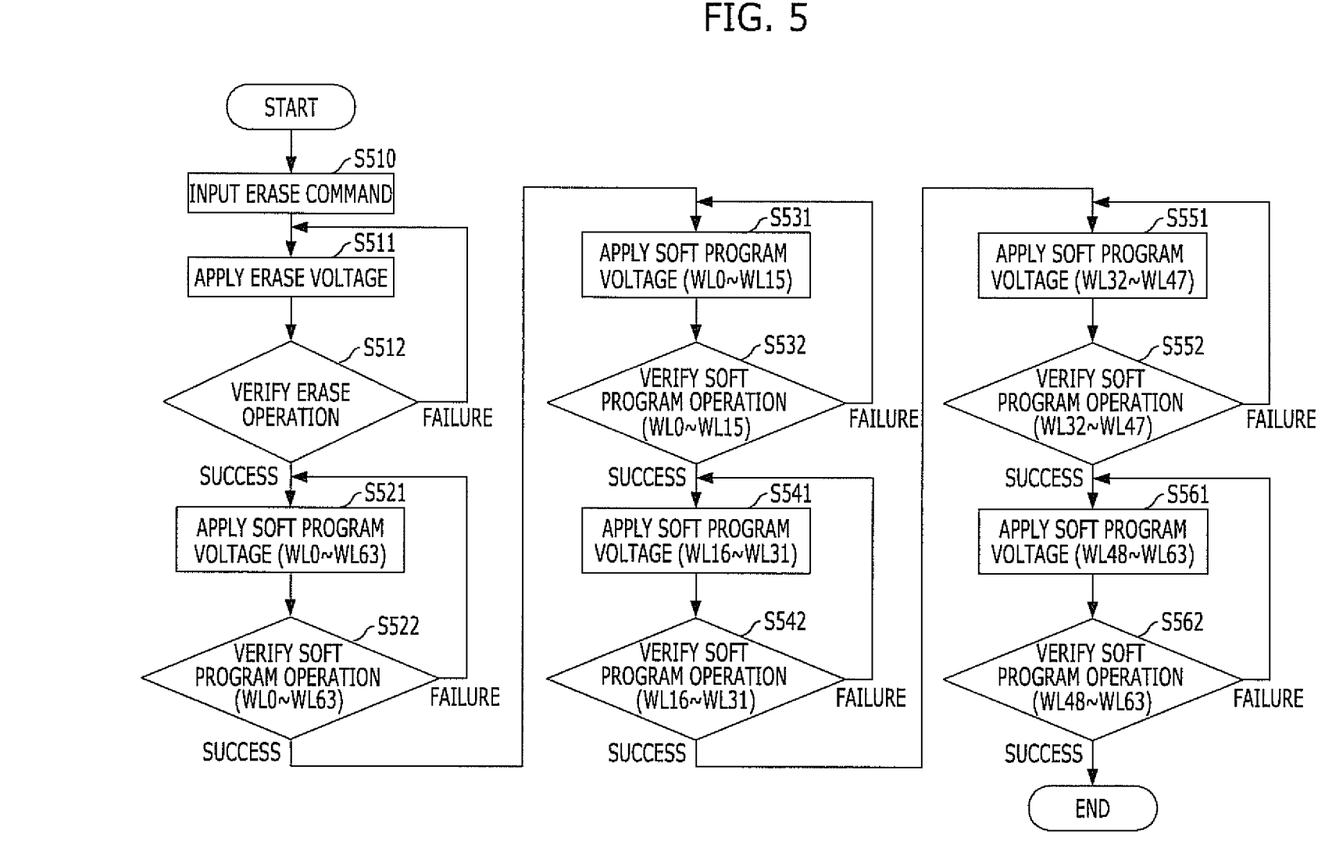
FIG. 5 is a flowchart describing a method for operating a non-volatile memory device in accordance with a first embodiment of the present invention.

FIG. 5 is a flowchart describing a method for operating a non-volatile memory device in accordance with a first embodiment of the present invention. The figure particularly describes an erase operation and an SOC operation.

First, when an erase command and an address designating a memory block 400 to be erased are inputted to a decoder in step S510, a ground voltage is applied to the word lines WL0 to WL63 of the memory block 400 and an erase voltage is applied to a bulk of the memory block 400 so that the data stored in the memory cells MC of the memory block 400 are erased in step S511.

The erase voltage may be applied in an Incremental Step Pulse Erase (ISPE) method. In other words, the erase voltage may be incrementally increased by a designated level and applied until an erase operation succeeds based on an erase verification result, which will be described later. To perform the ISPE method, a bulk voltage generator, which is not illustrated in the figure, may generate a pulse-type erase voltage. The initial erase voltage may range from approximately 18V to approximately 20V, but the present invention is not limited to these exemplary voltages.

Subsequently in step S512, whether the data of all memory cells MC of the memory block 400 are erased or not is verified through a read operation of a page buffer, which is not illustrated in the figure. For example, when a particular string is verified after an erase operation, the non-volatile memory device evaluates whether a current path is formed between the bit lines BL0 to BLM and the string. The non-volatile memory device evaluates whether the current path is formed by applying a ground voltage to the word lines WL0 to WL63 and coupling pre-charged bit lines BL0 to BLM with the string. If any memory cell MC is not erased and programmed with a voltage equal to or higher than the ground voltage, the current path is not formed.

As a result of the verification, if any memory cell MC is not erased among the memory cells MC, the erase operation is decided to be a failure, and the process of the step S511 is repeated. If the erase operation is a failure, the subsequent erase command may apply an erase voltage that is increased by a designated level according to the ISPE method.

Conversely, when the erase operation is decided to be a success, the erase operation ends and the non-volatile device begins to perform the Soft program-On-Chip (SOC) operation in steps S521 to S562.

The SOC operation in the first embodiment of the present invention includes: a first SOC operation of steps S521 and S522 that is performed on all of the memory cells MC, and a second SOC operation of steps S531 to S562 that is performed for each word line group after the first SOC operation.

More specifically, in step S521, when the erase operation is finished, the SOC operation is performed on all the memory cells MC coupled with the word lines WL0 to WL63 by applying a soft program voltage to all the word lines WL0 to WL63 included in the memory block 400 while a ground voltage is applied to the bulk of the memory block 400.

The soft program voltage may be applied in an Incremental Step Pulse Program (ISPP) method. More specifically, the soft program voltage is incrementally increased by a designated level and applied based on the soft program verification result, which will be described later, until the SOC operation is performed successfully. The initial soft program voltage may range from approximately 10V to approximately 12V, and the soft program voltage may be increased up to approximately 18V. However, the present invention is not limited to the exemplary voltages.

Subsequently, the SOC operation is verified based on a verification voltage, which may be a negative voltage of approximately −1V to −2V, in step S522. The SOC operation verification is performed for each string. During the verification, the ground voltage is applied to the word lines WL0 to WL63 of the memory block 400. In short, whether there is a memory cell MC whose threshold voltage is increased to the verification voltage among the memory cells MC of each string is decided.

As a result of the verification, if the number of pass strings including a memory cell whose threshold voltage is raised to the verification voltage does not reach a predetermined number X, specifically, when the SOC operation is decided to be a failure, the soft program voltage is increased by a designated increment and the process of the step S521 is repeated. The operation of the step S521 is carried out by applying a bit line program prevention voltage, e.g., a power source voltage Vcc, to the bit lines coupled with pass strings, and applying a bit line program voltage, e.g., 0V, to the bit lines coupled with non-pass strings.

Conversely, if the number of pass strings reaches the predetermined number X, specifically, when the SOC operation is decided to be a success, the first SOC operation ends and the method begins second SOC operation.

As described above, the second SOC operation is performed onto the memory cells MC after the first SOC operation, and the second SOC operation is performed by grouping the word lines WL0 to WL63 included in the memory block 400 into several word line groups and applying the soft program voltage to each word line group and verifying the second SOC operation for each word line group. By performing the second SOC operation in word line groups, some memory cells that are not soft programmed during the first SOC operation due to the different characteristics of the memory cells according to the position of the memory cells are soft programmed during the second SOC operation to increase the threshold voltage of the memory cells. Therefore, the range of threshold voltage distribution of the memory cells after the second SOC operation may become narrow.

In the first embodiment of the present invention, the word lines WL0 to WL63 are grouped into four word line groups WL0 to WL15, WL16 to WL31, WL32 to WL47, and WL48 to WL63, and each word line group includes the same number of word lines, which is 16 word lines in this embodiment. The 16 word lines are sequentially arrayed. The first embodiment sequentially performs the SOC operation and the verification operation on each word line group starting with the word line group closest to the source selection line SSL and subsequently on each word line group from the source selection line SSL. Hereafter, the second SOC operation of the preset embodiment is described in detail.

First, in step S531, a soft program operation is performed onto the memory cells MC coupled with the word lines WL0 to WL15 of the first word line group by applying the soft program voltage to the word lines WL0 to WL15 of the first word line group. A pass voltage of approximately 6V to approximately 8V may be applied to the other word lines WL16 to WL63 while applying the soft program voltage to the first word line group.

Subsequently, a SOC operation is verified in step S532 based on a verification voltage. The SOC operation verification is performed for each string. In short, the non-volatile memory device decides whether there is a memory cell whose threshold voltage is equal to or exceeds the verification voltage among the memory cells MC coupled with the word lines WL0 to WL15 of the first word line group for each string. During the verification of the first word line group, a ground voltage may be applied to the word lines WL0 to WL15 of the first word line group, and a pass voltage of approximately 6V to approximately 8V may be applied to the other word lines WL16 to WL63.

As a result of the verification, when the number of pass strings including a memory cell whose threshold voltage is equal to or exceeds the verification voltage among the memory cells MC coupled with the word lines WL0 to WL15 of the first word line group does not reach a predetermined number X, the soft program operation is decided to be a failure, and the process of the step S531 is performed repeatedly by increasing the soft program voltage by a designated level until the soft program operation is not decided to be a failure. Just as in the operation of the step S521, the operation of the step S531 is also carried out by applying a bit line program prevention voltage, e.g., a power source voltage Vcc, to the bit lines coupled with pass strings, and applying a bit line program voltage, e.g., 0V, to the bit lines coupled with non-pass strings.

Conversely, if the number of pass strings reaches the predetermined number X, more specifically, when the soft program operation is decided to be a success, the soft program operation for the first word line group ends, and a soft program operation for the next word line group is performed. In short, a soft program operation is performed onto the memory cells MC coupled with the word lines WL16 to WL31 of the second word line group in step S541 by applying the soft program voltage to the word lines WL16 to WL31 of the second word line group. The method of performing a soft program operation onto the memory cells MC coupled with the word lines WL16 to WL31 of the second word line group is the same as the method of performing a soft program operation onto the memory cells MC coupled with the word lines WL0 to WL15 of the first word line group. More specifically, a soft program voltage is applied to the word lines WL16 to WL31 of the target word line group of the soft program operation, and a pass voltage of approximately 6V to approximately 8V may be applied to the word lines WL0 to WL15 and WL32 to WL63 of the other word line groups.

Subsequently, the soft program operation is verified based on a verification voltage in step S542. In short, it is decided whether there is a memory cell among the memory cells MC coupled with the word lines WL16 to WL31 of the second word line group of each string whose threshold voltage is equal to or exceeds the verification voltage. The method of verifying a soft program operation onto the memory cells MC coupled with the word lines WL16 to WL31 of the second word line group is the same as the method of verifying a soft program operation onto the memory cells MC coupled with the word lines WL0 to WL15 of the first word line group. More specifically, a ground voltage is applied to the word lines WL16 to WL31 of the target word line group of the soft program operation, and a pass voltage of approximately 6V to approximately 8V may be applied to the word lines WL0 to WL15 and WL32 to WL63 of the other word line groups during the verification of the memory cells coupled with the word lines WL16 to WL31 of the second word line group.

As a result of the verification, if the number of pass strings including a memory cell whose threshold voltage is equal to or exceeds the verification voltage among the memory cells MC coupled with the word lines WL16 to WL31 of the second word line group does not reach a predetermined number X, the soft program operation is decided to be a failure, and the process of the step S541 is performed repeatedly by increasing the soft program voltage by a designated level until the soft program operation is not decided to be a failure.

Conversely, if the number of pass strings reaches the predetermined number X, specifically, when the soft program operation is decided to be a success, the soft program operation for the second word line group ends and a soft program operation for the next word line group is performed. In short, a soft program operation is performed onto the memory cells MC coupled with the word lines WL32 to WL47 of the third word line group in step S551 by applying the soft program voltage to the word lines WL32 to WL47 of the third word line group.

Subsequently, the SOC operation verification is performed onto the memory cells MC coupled with the word lines WL32 to WL47 of the third word line group in step S552. Since the SOC operation verification is performed for each string in the same manner as described above, further description is omitted.

As a result of the verification, when the soft program operation is decided to be a failure, the process of the step S551 is repeated by increasing the soft program voltage by a designated level until the soft program operation is not decided to be a failure. When the soft program operation is decided to be a success, a soft program operation is performed onto the memory cells MC coupled with the word lines WL48 to WL63 of the fourth word line group in step S561.

Subsequently, the soft program verification operation is performed onto the memory cells MC coupled with the word lines WL48 to WL63 of the fourth word line group in step S562.

As a result of the verification, when the soft program operation is decided to be a failure, the process of the step S561 is repeated by increasing the soft program voltage by a predetermined level. When the soft program operation is decided to be a success, a second soft program operation is finished. The soft program operation and the soft program operation verification is performed for the third and fourth word line groups in the same way as it is performed for the first and second word line groups.

According to an embodiment of the present invention, the range of threshold voltage distribution of erase-state memory cells may be reduced. This will be described hereafter in detail by referring to FIG. 6.

Figure 6:
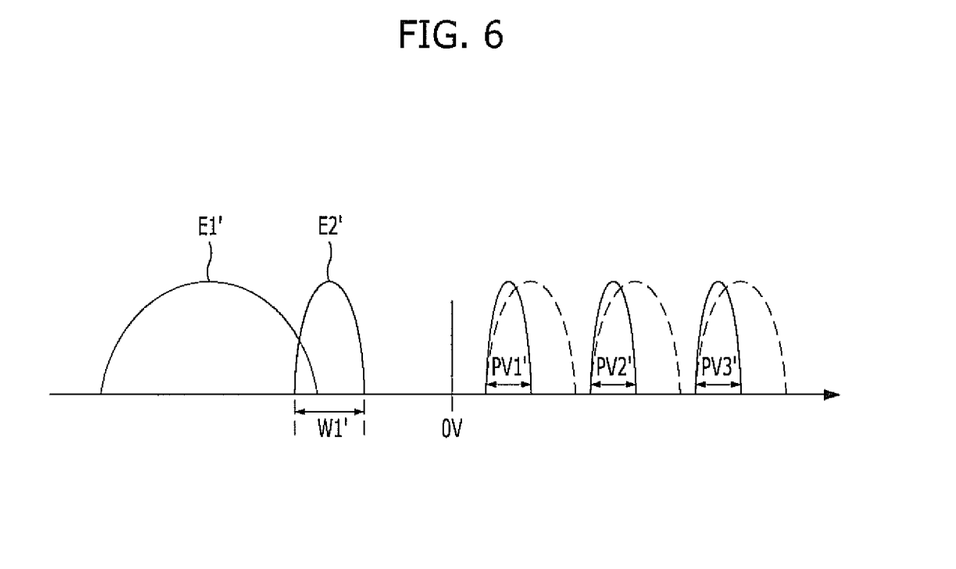
FIG. 6 illustrates an effect of the method for operating the non-volatile memory device in accordance with the first embodiment of the present invention.

FIG. 6 illustrates an effect of the method for operating the non-volatile memory device in accordance with the embodiment of the present invention.

As shown by FIG. 6, a curve E2' represents the threshold voltage distribution of memory cells after the first and second soft program operations, and a curve E1' represents the threshold voltage distribution of memory cells after an erase operation. As shown by FIG. 6, the curve E2' is shifted to the right when compared to curve E1'. Moreover, when FIG. 6 is compared to FIG. 3, the range W1' of the threshold voltage distribution of memory cells after the first and second soft program operations is narrower than with the range W1 of the conventional technology shown in FIG. 3. Accordingly, the widths PV1', PV2', and PV3' of the threshold voltage distribution of memory cells in a program state are decreased as well, thereby securing wider margins between states.

The distribution of the threshold voltage of the memory cells is narrower than the conventional technology because word lines are grouped into word line groups and a second soft program operation is performed for each word line group. By grouping the word lines into word line groups, memory cells which are not soft-programmed during a first soft program operation may be soft-programmed as well. In other words, the possibility that a memory cell is not soft-programmed during a soft program operation may be decreased even when a memory cell has been erased many times. Therefore, the width of the threshold voltage distribution in the erase state is decreased in overall.

Figure 7:
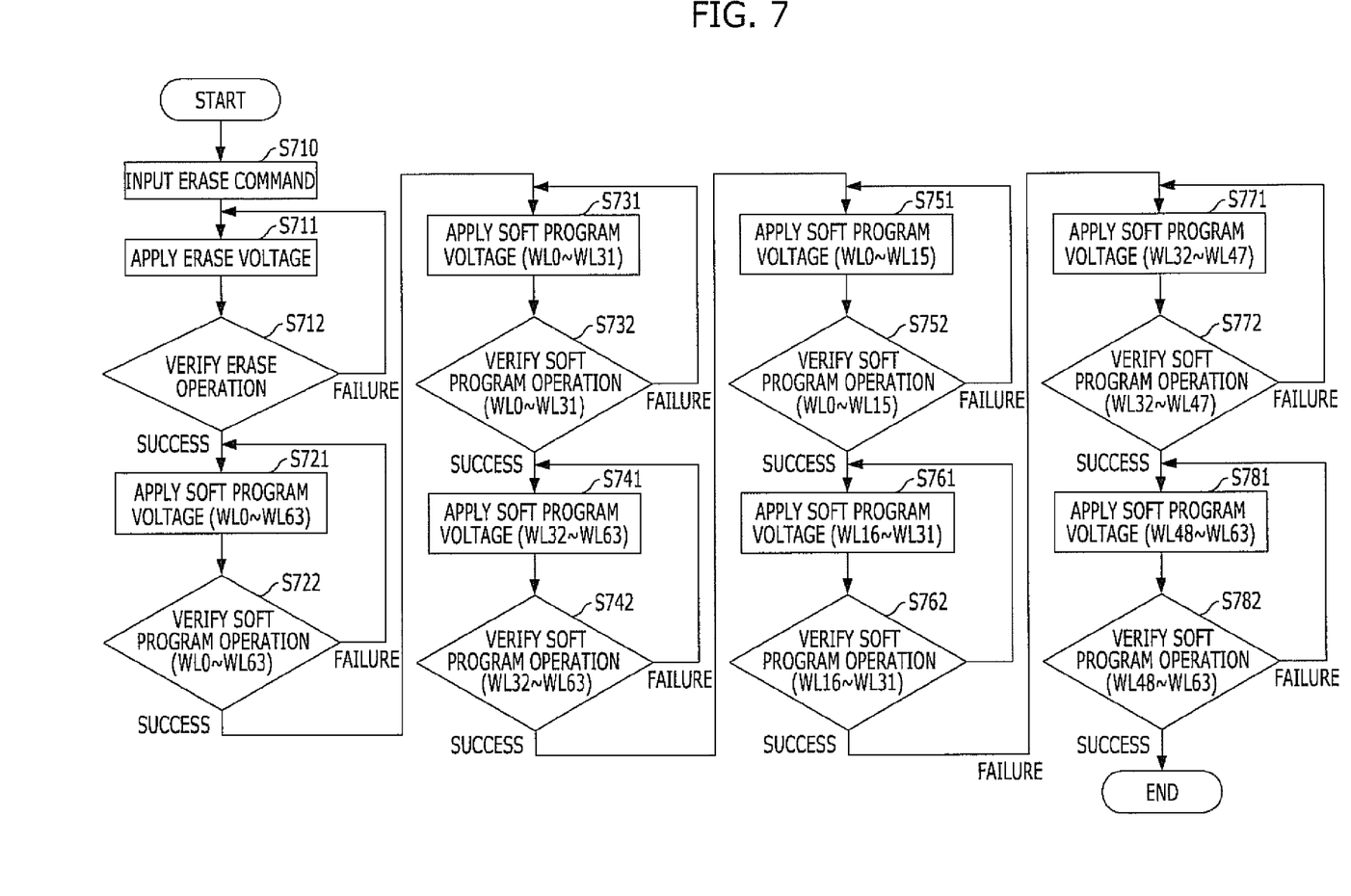
FIG. 7 is a flowchart describing a method for operating a non-volatile memory device in accordance with a second embodiment of the present invention.

FIG. 7 is a flowchart describing a method for operating a non-volatile memory device in accordance with a second embodiment of the present invention. In the description of this embodiment, descriptions of the previously described embodiment are omitted.

First, when an erase command and an address designating an a target memory block 400 to be erased are inputted in step S710, an erase voltage is applied to the bulk of the memory block 400 to erase the data stored in the memory cells of the memory block 400 in step S711.

Subsequently, whether the data of all the memory cells of the memory block 400 are erased or not is verified in step S712.

As a result of the verification operation, when the erase operation is decided to be a failure, the process of the step S711 is repeated until the erase operation is not decided to be a failure.

Conversely, when the erase operation is decided to be a success, the erase operation ends, and a soft program operation, which is to be described below, is performed in steps S721 through S782.

The soft program operation performed in this embodiment includes a first soft program operation (steps S721 and S722) that is performed onto all memory cells MC, a second soft program operation (steps S731 to S742) that is performed for the memory cells of each word line group after the first soft program operation, and a third soft program operation (steps S751 to S782) that is performed for each sub-group by dividing each word line group into two or more sub-groups.

The first soft program operation is the same as described in the first embodiment. To be specific, a soft program operation is performed onto all memory cells MC coupled with word lines WL0 to WL63 in step S721, and a soft program verification operation is performed onto all the memory cells MC coupled with word lines WL0 to WL63 in step S722. As a result of the soft program verification operation, when the soft program operation is decided to be a failure, the process of the step S721 is repeated by increasing a soft program voltage by a designated level until the soft program operation is not decided to be a failure. When the soft program operation is decided to be a success, the first soft program operation ends and the second soft program operation is performed.

The second soft program operation is performed onto the memory cells MC after the first soft program operation by grouping the word lines WL0 to WL63 included in a corresponding memory block 400 into multiple word line groups and performing a soft program operation and a verification operation to each word line is group. The second embodiment of the present invention illustrates that the word lines WL0 to WL63 are grouped into two word line groups WL0 to WL31 and WL32 to WL63 so that each word line group includes the same number of word lines, which is 32. The 32 word lines are sequentially arrayed. Also, in the second embodiment of the present invention, the processes of applying the soft program voltage and performing a verification operation are sequentially performed from a word line group that is closest to a source selection line SSL. Hereafter, the second soft program operation in accordance with the embodiment of the present invention is described in detail.

First, a soft program operation is performed onto the memory cells MC coupled with the word lines WL0 to WL31 of the first word line group in step S731, and then a verification operation is performed in step S732.

As a result of the verification operation, when the soft program operation is decided to be a failure, the process of the step S731 is repeated by increasing a soft program voltage by a designated level until the soft program operation is not decided to be a failure.

Conversely, when the soft program operation is decided to be a success, the soft program operation is performed onto the memory cells MC coupled with the word lines WL32 to WL63 of the second word line group in step S741 and then a verification operation is performed in step S742.

As a result of the verification operation, when the soft program is operation is decided to be a failure, the process of the step S741 is repeated by increasing the soft program voltage by a designated level until the soft program operation is not decided to be a failure.

Conversely, when the soft program operation is decided to be a success, the second soft program operation ends, and a third soft program operation is performed.

As described above, the third soft program operation is performed onto the memory cells MC after the second soft program operation by dividing each word line group into more than two sub-groups, and performing a soft program operation and a verification operation to each sub-group. By performing a soft program operation on each sub-group, some memory cells that are not soft-programmed during the first and second soft program operations may be soft-programmed during the third soft program operation. As a result, the range of the threshold voltage of the memory cells after the third soft program operation may become even narrower. This embodiment of the present invention illustrates that the word lines WL0 to WL31 of the first word line group are grouped into two sub-groups WL0 to WL15 and WL16 to WL31 and the word lines WL32 to WL63 of the second word line group are grouped into two sub-groups WL32 to WL47 and WL48 to WL63 so that each sub-group includes the same number of word lines, which is 16. Also, the 16 word lines are sequentially arrayed. Also, in this embodiment of the present invention, the processes of applying the soft program voltage and performing a verification operation are sequentially performed from a sub-group that is close to a source selection line SSL. Hereafter, the third soft program operation in accordance with the embodiment of the present invention is described in detail.

First, a soft program operation is performed onto the memory cells MC coupled with the word lines WL0 to WL15 of the first sub-group in step S751, and then a verification operation is performed in step S752.

As a result of the verification operation, when the soft program operation is decided to be a failure, the process of the step S751 is repeated by increasing the soft program voltage by a designated level until the soft program operation is not decided to be a failure.

Conversely, when the soft program operation is decided to be a success, the soft program operation is performed onto the memory cells MC coupled with the word lines WL16 to WL31 of the second sub-group in step S761 and then a verification operation is performed in step S762.

As a result of the verification operation, when the soft program operation is decided to be a failure, the process of the step S761 is repeated by increasing the soft program voltage by a designated level until the soft program operation is not decided to be a failure.

Conversely, when soft program operation is decided to be a success, a soft program operation is performed onto the memory cells MC coupled with the word lines WL32 to WL47 of a third sub-group in step S771 and then a verification operation is performed in step S772.

As a result of the verification operation, when the soft program operation is decided to be a failure, the process of the step S771 is repeated by increasing the soft program voltage by a designated level until the soft program operation is not decided to be a failure.

Conversely, when soft program operation is decided to be a success, a soft program operation is performed onto the memory cells MC coupled with the word lines WL48 to WL63 of a fourth sub-group in step S781 and then a verification operation is performed in step S782.

As a result of the verification operation, when the soft program operation is decided to be a failure, the process of the step S781 is repeated by increasing the soft program voltage by a designated level until the soft program operation is not decided to be a failure.

Conversely, when the soft program operation is decided to be a success, the third soft program operation ends.

Figure 8:
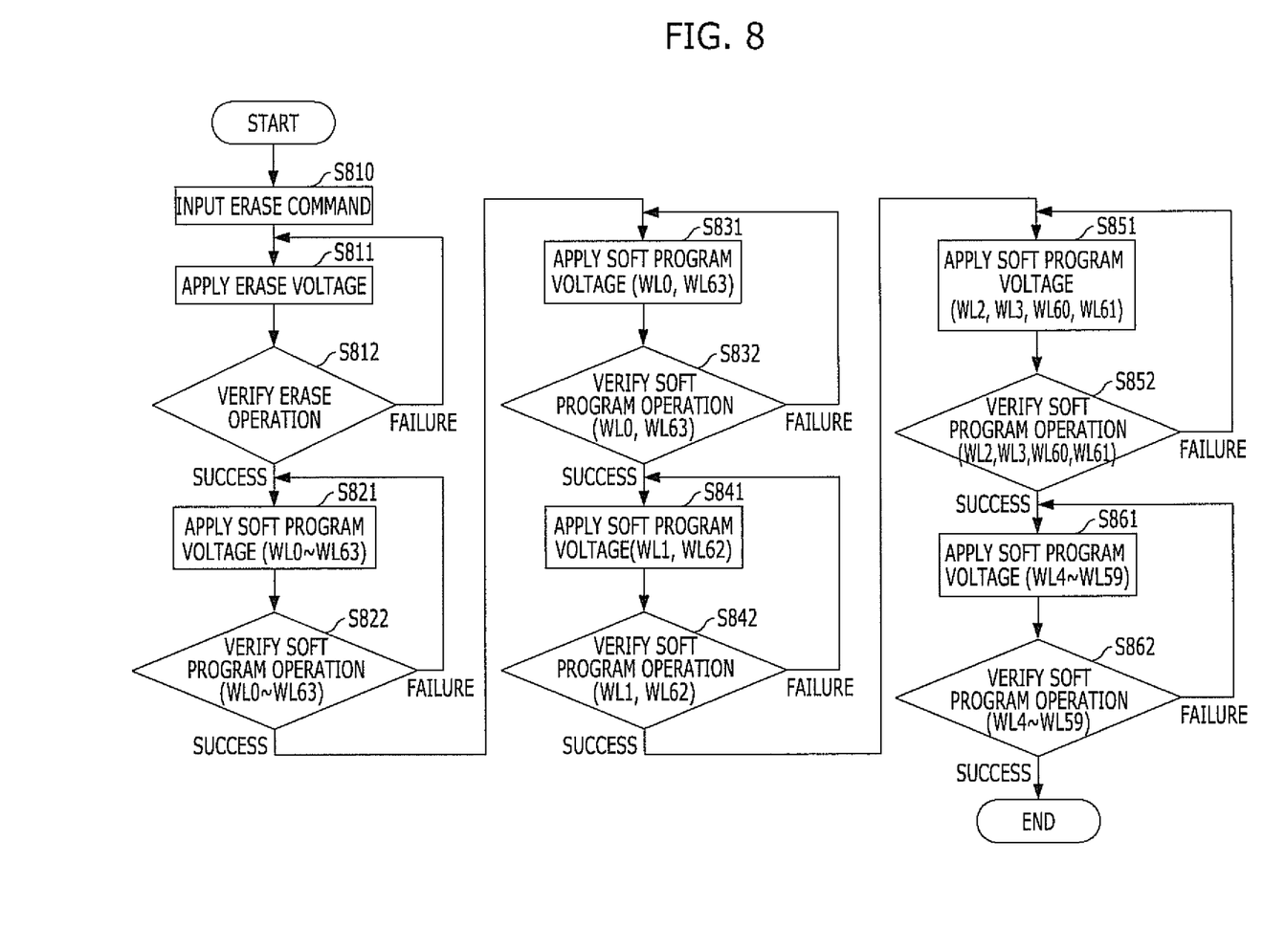
FIG. 8 is a flowchart describing a method for operating a non-volatile memory device in accordance with a third embodiment of the present invention.

FIG. 8 is a flowchart describing a method for operating a non-volatile memory device in accordance with a third embodiment of the present invention. In the description of this embodiment, descriptions of the previously described embodiment are omitted.

First, when an erase command and an address designating an a target memory block 400 to be erased are inputted in step S810, an erase voltage is applied to the bulk of the memory block 400 to erase the data stored in the memory cells of the memory block 400 in step S811.

Subsequently, whether the data of all the memory cells of the memory block 400 are erased or not is verified in step S812.

As a result of the verification operation, when the erase operation is decided to be a failure, the process of the step S811 is repeated until the erase operation is not decided to be a failure.

Conversely, when the erase operation is decided to be a success, the erase operation ends, and a soft program operation, which is to be described below, is performed in steps S821 through S862.

The soft program operation performed in the third embodiment includes a first soft program operation (steps S821 and S822) that is performed onto all memory cells MC, a second soft program operation (steps S831 to S862) that is performed for the memory cells of each word line group after the first soft program operation, which is the same as the first embodiment shown in FIG. 5. However, the method of grouping the word lines during the second soft program operation is different from that of FIG. 5.

The first soft program operation is the same as described in the first and second embodiment. More specifically, a soft program operation is performed onto all memory cells MC coupled with word lines WL0 to WL63 in step S821, and a soft program verification operation is performed onto all the memory cells MC coupled with word lines WL0 to WL63 in step S822. As a result of the soft program verification operation, when the soft program operation is decided to be a failure, the process of the step S821 is repeated by increasing a soft program voltage by a designated level until the soft program operation is not decided to be a failure. When the soft program operation is decided to be a success, the first soft program operation ends and the second soft program operation is performed.

The second soft program operation is performed onto the memory cells MC after the first soft program operation by grouping the word lines WL0 to WL63 included in a corresponding memory block 400 into multiple word line groups, applying a soft program voltage to each word line group, and performing a verification operation, which is the same as the previously described embodiment. The third embodiment of the present invention illustrates that the word lines WL0 to WL63 are grouped into four word line groups (WL0, WL63), (WL1, WL62), (WL2, WL3, WL60, WL61) and (WL4 to WL59) according to the distance from both a drain selection line DSL and a source selection line SSL. In this embodiment, the word line groups may have a different number of word lines, for example, a word line group including two word lines, a word line group including two word lines, a word line group including four word lines, and a word line group including 56 word lines. Also, in this embodiment of the present invention, the processes of applying the soft program voltage and performing a verification operation are sequentially performed from a word line group that is closest to the two selection lines DSL and SSL, and sequentially performing the soft program voltage operation on the groups further away from the two selection lines DSL and SSL. The groups are grouped in this manner because the characteristics of a memory cell become different as the word line coupled with the memory cell is disposed closer to the drain selection line DSL or the source selection line SSL. Therefore, the characteristics of the memory cells may be considered by grouping a small number of the word lines disposed on the edge region together and grouping a larger number of the word lines disposed in the center region together. Hereafter, the second soft program operation in accordance with the embodiment of the present invention is described in detail.

First, a soft program operation is performed onto the memory cells MC coupled with the word lines (WL0, WL63) of the first word line group in step S831, and then a verification operation is performed in step S832.

As a result of the verification operation, when the soft program operation is decided to be a failure, the process of the step S831 is repeated by increasing a soft program voltage by a designated level until the soft program operation is not decided to be a failure.

Conversely, when the soft program operation is decided to be a success, the soft program operation is performed onto the memory cells MC coupled with the word lines (WL1, WL62) of the second word line group in step S841 and then a verification operation is performed in step S842.

As a result of the verification operation, when the soft program operation is decided to be a failure, the process of the step S841 is repeated by increasing the soft program voltage by a designated level until the soft program operation is not decided to be a failure.

Conversely, when the soft program operation is decided to be a success, a soft program operation is performed onto the word lines (WL2, WL3, WL60, WL61) of the third word line group in step S851, and a verification operation is performed in step S852.

As a result of the verification operation, when the soft program operation is decided to be a failure, the process of the step S851 is repeated by increasing the soft program voltage by a designated level until the soft program operation is not decided to be a failure.

Conversely, when the soft program operation is decided to be a success, the soft program operation is performed onto the word lines WL4 to WL59 of the fourth word line group in step S861 and then a verification operation is performed in step S862.

As a result of the verification operation, when the soft program operation is decided to be a failure, the process of the step S861 is repeated by increasing the soft program voltage by a designated level until the soft program operation is not decided to be a failure. When the soft program operation is decided to be a success, the second soft program operation ends.

According to the third embodiment of the present invention, the efficiency of a soft program operation may be increased by grouping the memory cells of similar characteristics and performing the soft program operation onto the group of the memory cells of similar characteristics. As described above, since the characteristics of a memory cell are greatly affected by the position in a string, memory cells may be grouped in consideration of the position in the string.

Figure 9:
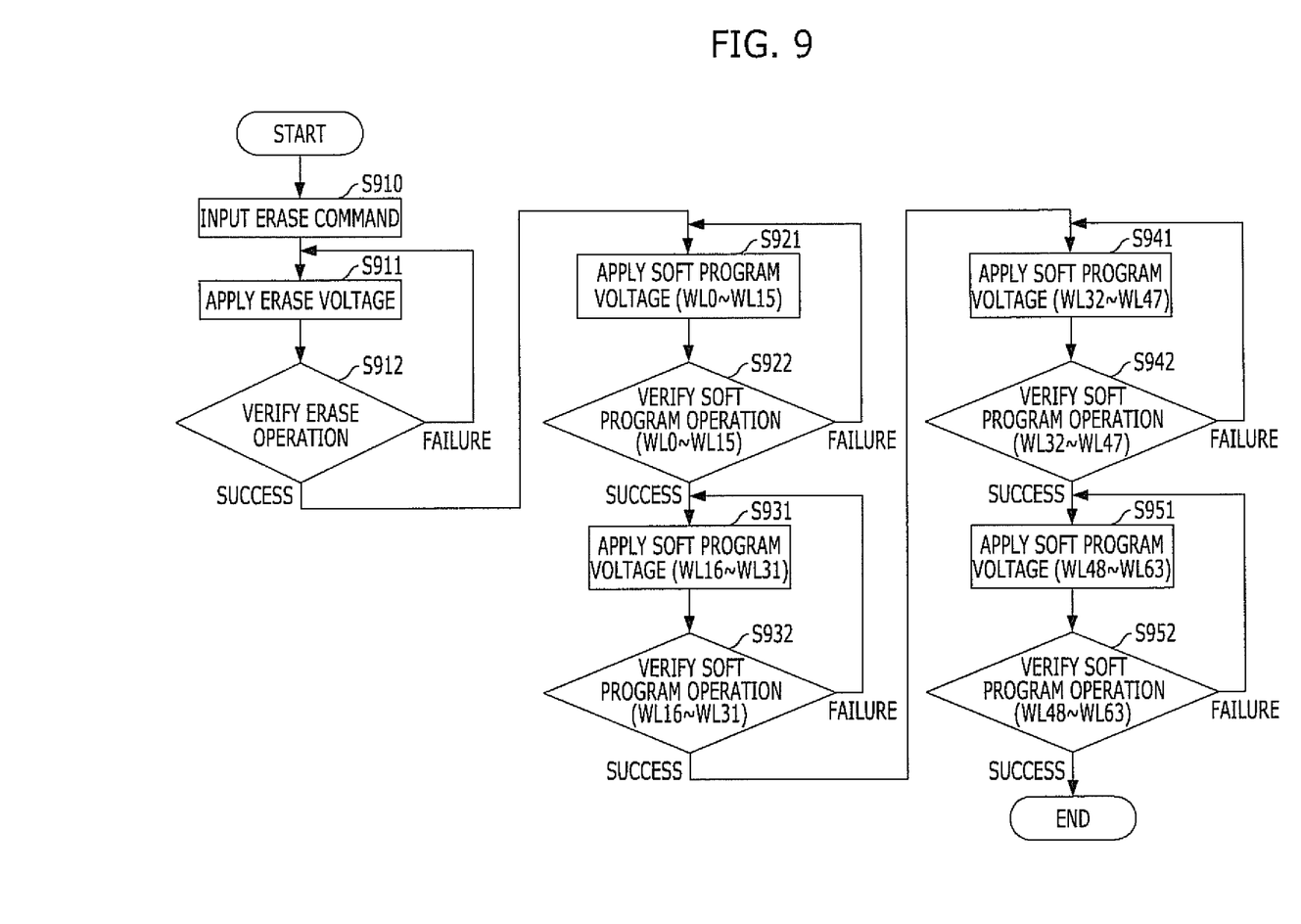
FIG. 9 is a flowchart describing a method for operating a non-volatile memory device in accordance with a fourth embodiment of the present invention.

FIG. 9 is a flowchart describing a method for operating a non-volatile memory device in accordance with the fourth embodiment of the present invention. In the description of this embodiment, descriptions of the previously described embodiment are omitted.

The fourth embodiment is different from the first embodiment shown in FIG. 5 in that the first soft program operation that is performed onto all the memory cells MC is skipped, and the second soft program operation that is performed onto the word line groups is carried out after an erase operation and a verification operation. In other words, the second soft program operation of the present embodiment is performed onto the memory cells MC after an erase operation is carried out, and the second soft program operation is performed for each word line group. This is described in detail below.

First, when an erase command and an address designating an a target memory block 400 to be erased are inputted in step S910, an erase voltage is applied to the bulk of the memory block 400 to erase the data stored in the memory cells of the memory block 400 in step S911.

Subsequently, whether the data of all the memory cells of the memory block 400 are erased or not is verified in step S912.

As a result of the verification operation, when the erase operation is decided to be a failure, the process of the step S911 is repeated until the erase operation is not decided to be a failure.

Conversely, when the erase operation is decided to be a success, the erase operation ends, and a second soft program operation, which is to be described below, is performed in steps S921 through S952.

The method of grouping word lines for the second soft program operation and the method of performing the soft program operation for the fourth embodiment is substantially similar to the first embodiment.

Although several embodiments of the present invention are described above, the present invention is not limited to only the four embodiments described above. The technology of the present invention may be applied to all embodiments where word lines are grouped and a soft program operation is performed onto each word line group.

For example, modifications may be made to have 16 word lines or 32 word lines. Also, although the number of the word line groups for the second soft program operation is 4 in the embodiment of FIG. 5 or FIG. 9, the number of the word line groups is not limited to a specific number as long as the number is more than 2.

Also, although the embodiment of FIG. 5 or FIG. 9 illustrates that the number of word lines of each word line group during the second soft program operation is the same, the number of the word lines of the word line groups may be different as long as the number is more than 1.

Also, although the embodiment of FIG. 5, FIG. 7 or FIG. 9 illustrates that the word lines of each word line group are adjacent to each other, in other words, the word lines of each word line group are sequentially arrayed, the word lines of each word line group may be disposed differently. For example, word lines on the order of even numbers may be grouped together, and word lines on the order of odd numbers may be grouped together.

Also, although the embodiment of FIG. 7 shows a case where the number of sub-groups that belong to each word line group is two during the third soft program operation, the number of sub-groups may be different. Furthermore, the number of word lines that belong to each sub-group or the method of arraying the word lines may be diverse as well.

Also, although the embodiment of FIG. 8 illustrates a case where the word lines are grouped into four word line groups (WL0, WL63), (WL1, WL62), (WL2, WL3, WL60, WL61), and (WL4 to WL59) based on the position of the word lines, the number of word line groups, the number of word lines that belong to a word line group, and the arrangement may be modified diversely. For example, the word lines may be grouped into three word line groups (WL0, WL63), (WL1, WL2, WL61, WL62), and (WL3 to WL60).

Lastly, the first soft program operation may be omitted in all embodiments, or the third soft program operation may be performed in all embodiments.

According to the method of operating a non-volatile memory device, an erase operation and a soft program operation may be performed in such a manner that the range of threshold voltage distribution of erase-state memory cells is decreased.

While the present invention has been described with respect to the specific embodiments, it will be apparent to those skilled in the art that various changes and modifications may be made without departing from the spirit and scope of the invention as defined in the following claims.

What is claimed is:

1. A method for operating a non-volatile memory device, comprising:
performing an erase operation onto a memory block including a plurality of memory cells which are coupled to first to Nth word lines where N is a natural number of 4 or more, wherein the first to Nth word lines are arranged between a source selection line and a drain selection line so that the first word line is closest to the source selection line and the Nth word line is farthest to the source selection line; and
grouping the first to Nth word lines into at least two word line groups, and performing a second soft program operation onto memory cells coupled with the word lines of each word line group,
wherein the first word line and the Nth word line belong to a first word line group of the word line groups, and a kth word line and a (N-k+1)th word line belong to a second word line group of the word line groups where k is a natural number of 2 or more and N-1 or less, and the first word line group and the second word line group are different from each other.

2. The method of claim 1, further comprising:
performing a first soft program operation onto all the memory cells of the memory block, after the erase operation and before the second soft program operation.

3. The method of claim 1, further comprising:
grouping word lines of at least one word line group among the word line groups into a plurality of sub-groups, and performing a third soft program operation onto memory cells coupled with the word lines of each of the sub-groups after the second soft program operation is performed.

4. The method of claim 3, wherein the sub-groups have the same number of word lines.

5. The method of claim 3, further comprising performing the second soft program operation again if the second soft program operation is determnined to be a failure.

6. The method of claim 1, wherein the word line groups have the same number of word lines.

7. The method of claim 1, wherein the second soft program operation is performed to sequentially soft-program the word line groups from a word line group close to the source and drain selection lines.

8. The method of claim 1, wherein the second soft program operation comprise:
applying a soft program voltage to the plurality of memory cells; and
verifying the soft program operation by determining whether a memory cell among the plurality of memory cells has a voltage above a threshold voltage.

9. The method of claim 1, wherein the second soft program operation is performed to apply a soft program voltage which is incrementally increased by a designated level.

* * * * *